(12) United States Patent
Mentovich et al.

(10) Patent No.: US 12,114,416 B2
(45) Date of Patent: Oct. 8, 2024

(54) HEAT REMOVAL FROM SILICON PHOTONICS CHIP USING A RECESSED SIDE-BY-SIDE THERMAL DISSIPATION LAYOUT

(71) Applicant: MELLANOX TECHNOLOGIES, LTD., Yokneam (IL)

(72) Inventors: Elad Mentovich, Tel Aviv (IL); Anna Sandomirsky, Nesher (IL); Dimitrios Kalavrouziotis, Papagou (GR)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 429 days.

(21) Appl. No.: 17/517,693

(22) Filed: Nov. 3, 2021

(65) Prior Publication Data

US 2022/0061148 A1    Feb. 24, 2022

Related U.S. Application Data

(63) Continuation-in-part of application No. PCT/GR2019/000032, filed on May 7, 2019.

(51) Int. Cl.
*H05K 1/02* (2006.01)
*H01L 23/367* (2006.01)
(Continued)

(52) U.S. Cl.
CPC ......... *H05K 1/0206* (2013.01); *H01L 23/367* (2013.01); *H01L 23/38* (2013.01);
(Continued)

(58) Field of Classification Search
CPC .... H05K 1/0206; H05K 1/0298; H05K 1/183; H05K 3/30; H01L 23/367; H01L 23/38; H01L 23/13; H10N 10/13
See application file for complete search history.

(56) References Cited

U.S. PATENT DOCUMENTS 5,339,519 A * 8/1994 Fortune ................ H05K 1/0207
174/16.3
5,907,189 A    5/1999 Mertol
(Continued)

OTHER PUBLICATIONS

Moscoso-Matir et al., "Silicon Photonics Transmitter with SOA and Semiconductor Mode-Locked Laser," Scientific Reports, Springer Nature, Online Publication, pp. 1-15, Oct. 24, 2017.
(Continued)

*Primary Examiner* — Steven T Sawyer
(74) *Attorney, Agent, or Firm* — MEITAR PATENTS LTD.

(57) ABSTRACT

A semiconductor device assembly (10) includes a multi-layer printed circuit board (PCB—40), a thermoelectric cooler (TEC—30), a chip (22), and packaged integrated circuitry (IC—26). The multi-layer PCB includes a lateral heat conducting path (60) formed in a recessed area (44) of the PCB. The TEC and the chip are disposed on the PCB, side-by-side to one another over the lateral heat conducting path. The TEC is configured to evacuate heat from the chip via the lateral heat conducting path, and to dissipate the evacuated heat via a first end of a heat sink (33) in thermal contact with the TEC. The packaged IC is disposed on an un-recessed area of the PCB, wherein the packaged IC is configured to dissipate heat via a second end of the heat sink that is in thermal contact with the packaged IC.

18 Claims, 3 Drawing Sheets

(51) Int. Cl.
   *H01L 23/38*   (2006.01)
   *H05K 1/18*    (2006.01)
   *H05K 3/30*    (2006.01)
   *H01L 23/13*   (2006.01)
   *H10N 10/13*   (2023.01)

(52) U.S. Cl.
   CPC ........... *H05K 1/0298* (2013.01); *H05K 1/183* (2013.01); *H05K 3/30* (2013.01); *H01L 23/13* (2013.01); *H10N 10/13* (2023.02)

(56) References Cited

U.S. PATENT DOCUMENTS

| | | |
|---|---|---|
| 6,094,919 A | 8/2000 | Bhatia |
| 6,415,612 B1 | 7/2002 | Pokharna et al. |
| 6,639,242 B1 | 10/2003 | Chen et al. |
| 8,063,298 B2 | 11/2011 | Koester et al. |
| 2012/0206882 A1 | 8/2012 | Mohammed et al. |
| 2016/0119062 A1 | 4/2016 | Christensen |
| 2017/0229368 A1 | 8/2017 | Chiu et al. |
| 2019/0028189 A1* | 1/2019 | Teranishi ............. G02B 6/4204 |
| 2019/0036298 A1* | 1/2019 | Fujimura ............... H01S 5/0237 |
| 2019/0271819 A1* | 9/2019 | Meade ................. G02B 6/4269 |
| 2019/0326192 A1* | 10/2019 | Eid ..................... H01L 23/3675 |
| 2019/0341359 A1* | 11/2019 | Tang ........................ H01L 24/95 |
| 2020/0105639 A1* | 4/2020 | Valavala ............... H01L 23/373 |
| 2020/0292297 A1* | 9/2020 | Atala ..................... G01B 11/25 |
| 2020/0312741 A1* | 10/2020 | Wan ........................ H01L 23/38 |

OTHER PUBLICATIONS

International Application # PCT/GR2019/000032 Search Report dated Jan. 30, 2020.

* cited by examiner

HEAT REMOVAL FROM SILICON PHOTONICS CHIP USING A RECESSED SIDE-BY-SIDE THERMAL DISSIPATION LAYOUT

CROSS-REFERENCE TO RELATED APPLICATIONS

This application is a continuation-in-part of PCT Application PCT/GR2019/000032, filed May 7, 2019, whose disclosure is incorporated herein by reference.

FIELD OF THE INVENTION

The present invention relates generally to removing heat from semiconductor device assemblies, and particularly to heat removal from photonic chips using combination of passive and thermoelectric cooling.

BACKGROUND OF THE INVENTION

Semiconductor device assemblies often employ means capable of removing heat from the assembled semiconductor devices. For example, U.S. Pat. No. 6,094,919 describes a package for an integrated circuit (IC) comprises a lid attached to a base, with the IC being disposed in a space or cavity between the lid and the base. A thermoelectric module (TEM) having first and second primary surfaces is incorporated into a section of the lid. The first primary surface is thermally coupled to the IC such that application of power to the TEM causes heat to be transferred away from the IC.

As another example, U.S. Pat. No. 8,063,298 describes a method of forming a thermoelectric device that may include providing a substrate having a surface, and thermally coupling a thermoelectric p-n couple to a first portion of the surface of a substrate. Moreover, the thermoelectric p-n couple may include a p-type thermoelectric element and an n-type thermoelectric element. In addition, a thermally conductive field layer may be formed on a second portion of the surface of the substrate adjacent the first portion of the surface of the substrate.

SUMMARY OF THE INVENTION

An embodiment of the present invention provides a semiconductor device assembly including a multi-layer printed circuit board (PCB), a thermoelectric cooler (TEC) a chip, and packaged integrated circuitry (IC). The multi-layer PCB includes a lateral heat conducting path formed in a recessed area of the PCB. The TEC and the chip are disposed on the PCB, side-by-side to one another over the lateral heat conducting path. The TEC is configured to evacuate heat from the chip via the lateral heat conducting path, and to dissipate the evacuated heat via a first end of a heat sink in thermal contact with the TEC. The packaged IC is disposed on an un-recessed area of the PCB, wherein the packaged IC is configured to dissipate heat via a second end of the heat sink that is in thermal contact with the packaged IC.

In some embodiments, the chip includes a silicon photonics (SiPh) chip.

In some embodiments, the lateral heat conducting path includes heat conducting layers of the PCB, which are in thermal contact with an external surface of the heat conducting path via vertical heat conducting channels.

In an embodiment, the vertical heat conducting channels of the PCB are filled with thermally conductive material. In another embodiment, the lateral heat conducting path is thermally isolated from the IC.

In some embodiments, the heat sink is attached to a top side of the TEC and to a top side of the packaged IC, and the top sides of the TEC and the packaged IC are laterally separated by at least a lateral size of the chip.

In some embodiments, the assembly further includes a control circuit configured to adaptively control the TEC based on an operating power of the chip.

In some embodiments, the chip includes one or more optical components, and the assembly further includes a control circuit configured to control one more operating wavelengths of the optical components by adaptively controlling the TEC. In an example embodiment, the chip includes a temperature sensor, and the control circuit is configured to control the operating wavelengths by obtaining a reading of the temperature sensor and controlling the TEC based on the reading. In a disclosed embodiment, by controlling the TEC, the control circuit is configured to tune an operating wavelength range of the optical components.

In other embodiments, the chip includes one or more temperature control devices, and the control circuit is configured to control the operating wavelengths by controlling both the TEC and the one or more temperature-control devices. In an embodiment, the temperature-control devices are configured to control temperatures of respective optical components associated with respective communication channels, and the control circuit is configured to individually tune the operating wavelengths of the respective communication channels by controlling the respective temperature-control devices.

There is additionally provided, in accordance with an embodiment of the present invention, a manufacturing method, including forming in a recessed area of a multi-layer printed circuit board (PCB) a lateral heat. conducting path. A thermoelectric cooler (TEC) and a chip are disposed on the PCB, side-by-side to one another on the lateral heat conducting path, wherein the TEC is configured to evacuate heat from the chip via the lateral heat conducting path, and to dissipate the evacuated heat via a first end of a heat sink in thermal contact with the TEC. Packaged integrated circuitry (IC) is disposed on an un-recessed area of the PCB, wherein the packaged IC is configured to dissipate heat via a second end of the heat sink that is in thermal contact with the packaged IC.

The present invention will be more fully understood from the following detailed description of the embodiments thereof, taken together with the drawings in which:

DETAILED DESCRIPTION OF EMBODIMENTS

Overview

Figure 1:
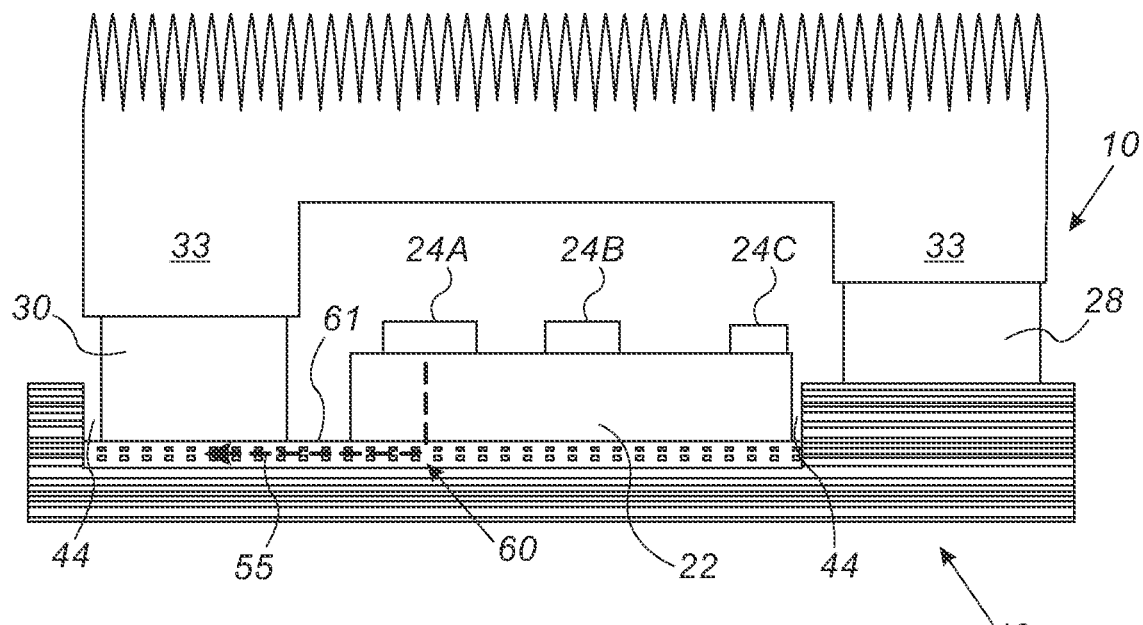
FIG. 1 is a side view of a semiconductor device assembly comprising a thermoelectric cooler (TEC) and a silicon photonics (SiPh) chip disposed side-by-side over a lateral heat conducting path, in accordance with an embodiment of the present invention.

Network devices, such as elements of network switches and network adapters, need to be robust in order to enable high data-rate communication traffic at sites having poor or no thermal management. At the same time, some semiconductor devices of such network elements, such as photonic devices (e.g., diode lasers, semiconductor optical amplifiers (SOA), and photodiodes) are considered sensitive to ambient temperature, in aspects of operational stability and reliability.

Conventionally, in order to remove heat from packaged semiconductor devices included in such devices, high air flow and bulky heat removal elements are required, such as an active thermoelectric cooler (TEC) that is often operated at a maximal power. Furthermore, achieving sufficient heat removal capacity may require a physically large configuration in which, for example, a passive cooling block is mounted back-to-back with the TEC, with the TEC placed back-to-back with the packaged semiconductor devices. Despite such efforts, photonic devices may occasionally experience high temperatures, for example, due to heat flowing from a nearby high-power electronic chip or due to fan failures.

Embodiments of the present invention that are described hereinafter provide improved techniques for heat removal from a semiconductor device assembly, such as a network element including temperature sensitive semiconductor devices (e.g., photonic devices). The disclosed techniques employ a compact configuration of a thermal solution having a dedicated lateral thermal heat removal solution from temperature sensitive devices, such as photonic devices. In some embodiments, the disclosed technique employs a multi-layer printed circuit board (PCB) comprising a lateral heat conducting path that is formed in a recessed area of the PCB. The heat conducting path includes heat conducting layers of the PCB that are in thermal contact with an external surface of the heat conducting path via vertical heat conducting channels. A TEC and a chip, such as a silicon photonics (SiPh) chip, are disposed side-by-side on the external surface of the lateral heat conducting path. The TEC is configured to evacuate heat from the SiPh chip via the lateral heat conducting path, and to dissipate the evacuated heat via a first end of a heat sink in thermal contact with the TEC. In addition, packaged integrated circuitry (IC) is disposed on an un-recessed area of the PCB, with the packaged IC configured to passively dissipate heat via a second end of the heat sink that is in thermal contact with the packaged IC.

In some embodiments, the disclosed lateral heat conducting path is thermally isolated from other elements of the assembly, such as from the IC, thereby ensuring a stable and predictable heat removal rate from the photonic devices regardless of a varying thermal output of other heat sources in the assembly, such as of the IC. In an embodiment, a control circuit, such as included in the assembly (e.g., in the packaged IC), adaptively controls the TEC based on the (known) operating power of the photonic devices (e.g., of a diode laser). This feature enables running the TEC at low power when possible, and at full power only when necessary.

The vertical heat conducting channels (e.g., "vias") in the recessed area of the PCB are formed as part of a manufacturing process of the PCB of the disclosed assembly. In an embodiment, the vertical channels are subsequently filled (e.g., by being plated) with thermally conductive material, such as metal The heat conductive material may also cover the external surface of the heat conducting path.

In some embodiments, the heat conducting layers in the PCB are made extra thick to enable sufficient heat conducting capacity. In an embodiment, in order to achieve efficient heat flow from the bottom of the SiPh to existing heat conducting (e.g., metal) layers in the PCB, the vertical heat conducting channels may be filled by the same metal (e.g., copper). The heat conducting channels may be of one-dimensional and/or two-dimensional geometry, as described below.

In some embodiments, the TEC removes heat from semiconductor photonic devices that are disposed on the SiPh chip, such as diode lasers and semiconductor optical amplifiers (SOA). The TEC evacuates heat solely from these devices, enabling other electronics devices, such as a processor, to operate at elevated electronic chip temperatures that are otherwise prohibited due to the photonic devices. For example, the electronic chip, such as a processor, may be best operated at a temperature of 110° C. and, using the disclosed cooling techniques, the temperature of the photonic devices would be maintained up to 70° C. Without the disclosed lateral thermal solution, the operational temperature of the processor would have been restricted to sub 100° C., causing sub-optimal utilization of the processor. Moreover, in case of a temperature deviation, due to, for example, fan failure, without the disclosed lateral thermal solution the photonic devices may experience adverse temperatures as high as 85° C. In that respect, the disclosed heat removal technique "guards" the sensitive devices from being subjected to adverse temperature spikes, Thereby increasing The reliability of The devices.

The disclosed heat removal technique may also require less air cooling, which can reduce the form factor of the assembly, and the required electrical power for cooling. The disclosed technique may thus provide network devices capable of high data rate traffic at a reduced cost of a communication system.

Heat Removal from Silicon Photonics Chip Using a Recessed Side-By-Side Thermal Dissipation Layout FIG. 1 is a side view of a semiconductor device assembly 10 comprising a thermoelectric cooler (TEC) 30 and a silicon photonics (SiPh) chip 22 disposed side-by-side over a lateral heat conducting path 60, in accordance with an embodiment of the present invention. In the present example, assembly 10 is an opto-electronic transceiver used for realizing optical interconnects in datacenter environments.

Heat conducting path 60 is made in a recessed area 44 of a PCB 40 that is further processed to form path 60. Recessed area 44 comprises an external surface 61, with TEC 30 and SiPh chip 22 maintaining good thermal contact with path 60.

As seen, SiPh chip 22 includes one or more semiconductor devices 24. In the present example, a device 24A is a laser diode (e.g., a laser die), a device 24B is an SPA (e.g., an SOA die), and a device 24C is a photodiode. As seen, TEC 30 evacuates (55) heat from SiPh chip 22 generated by, or exposed to, photonic devices 24 via path 60. TEC 30 dissipates the evacuated heat into a heat sink 33.

Assembly 10 further comprises packaged integrated circuitry (IC) 28 disposed on an un-recessed area of PCB 40. Typically, packaged IC 28 includes driving and control electronics to drive and control photonic devices 24 disposed on SiPh chip 22. IC 28 generates heat that is evacuated directly by heat sink 33 that maintains a good thermal contact with the package of IC 28. Heat sink 33 is configured to maintain thermal equilibrium with the environment and to minimize any cross-thermal effects between heat dissipated from TEC 30 and heat dissipated from packaged IC 28. As seen, heat sink 33 has a U-shape, designed so as to enable optical access to the SiPh chip.

For example, after the assembly of heat sink 33, a fiber array is aligned and attached on the SiPh chip.

Lateral heat conducting path 60 is thermally isolated from packaged IC 28. This isolation ensures a stable and predictable heat removal rate directly from photonic devices 24, and independently of heat generated by packaged IC 28.

The side view shown in FIG. 1 is chosen purely for the sake of conceptual clarity. The design of partially recessed multilayer PCB 40, the layout of thermal channel 60, as well as the placement of TEC 30 and SiPh chip 22 may vary in alternative embodiments. Elements that are not mandatory for understanding of the disclosed techniques, such as electrical and optical interconnects, are omitted from the figure for simplicity of presentation.

Figure 2:
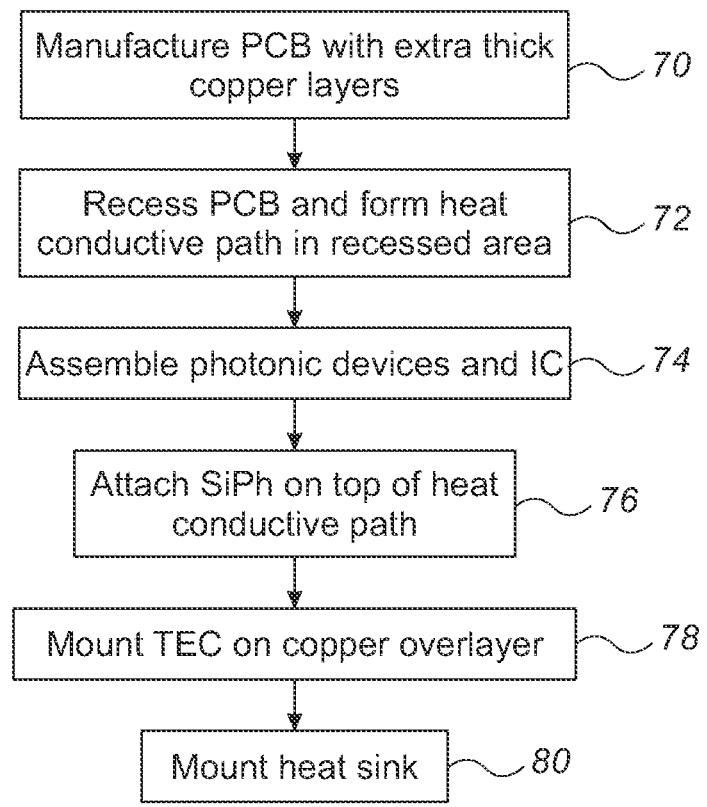
FIG. 2 is a flow chart that schematically illustrates a manufacturing method of the semiconductor device assembly of FIG. 1, in accordance with an embodiment of the present invention.

FIG. 2 is a flora chart that schematically illustrates a manufacturing method of semiconductor device assembly 10 of FIG. 1, in accordance with an embodiment of the present invention. The process begins at a PCB manufacturing step 70, with the design and manufacturing of PCB 40, including, in some cases, forming extra-thick metal layers 50 that have the capacity to conduct heat at a sufficient rate. Layers 50 are further described in FIG. 3.

Next, at a heat conducting path formation step 72, PCB 40 is recessed and a path 60 is made in the recessed area of PCB 40, as also described in FIG. 3.

Next, photonic devices 24 and packaged IC 28 are assembled and interconnected on SiPh chip 22 and PCB 40, respectively, at an assembly step 74.

Next, SiPh chip 22 is attached on top of path 60 in a manufacturing process that ensures good thermal contact between the two, at SiPh attachment step 74.

At a mounting step 78, TEC 30 is attached on top of thermal path 60 in a process that ensures good thermal contact between the two. Finally, at a heat sink mounting step 80, heat sink 33 is put on top of TEC 30 and packaged IC 28, in a process that ensures good thermal contact between them and heat sink 33.

The flow chart of FIG. 2 is brought by way of example. Such an assembly process typically includes many steps and processes that are omitted for sake of clarity. For example, details, such as type of material used for attaching the elements, wire bonding, and optical interconnecting, are omitted.

FIGS. 3A-3D are schematic sectional views showing successive stages in the manufacturing of the lateral heat conducting path over a recessed area of printed circuit board (PCB) 40 of FIG. 1, in accordance with an embodiment of the present invention. The manufacturing begins with accepting multilayer PCB 40, shown in side view in FIG. 3A, that comprises electrical insulating layers (48) and extra thick heat conducting layers (50). Extra thick layers 50, which may be as thick as 100 microns, are made of highly conductive thermal material, such as copper.

Figure 3A:
FIGS. 3A-3D are schematic sectional views showing successive stages in the manufacturing of the lateral heat conducting path over a recessed area of the printed circuit board (PCB) of FIG. 1, in accordance with an embodiment of the present invention.
Figure 3B:
Figure 3C:
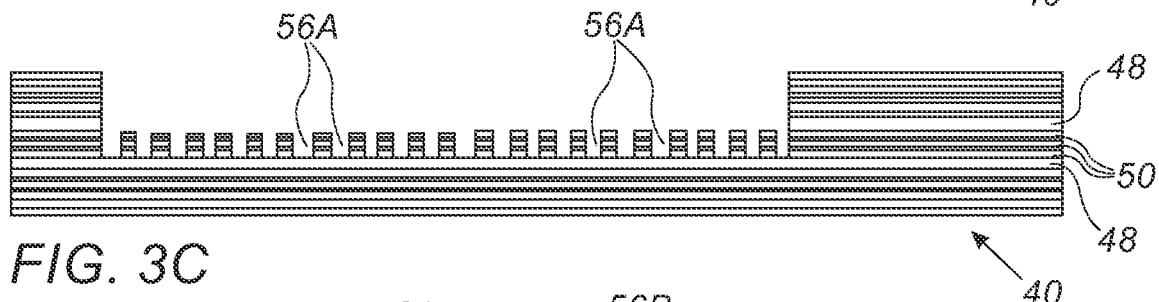

FIG. 3B shows PCB 40 after PCB 40 was recessed so as to enable thermal access to layers 50. The recess, in some cases, may be up to one millimeter deep. As seen in FIG. 3C, voids 56A are then formed in the recessed area, to expose, in part, side walls of layers 50. The voids may be formed in any one-dimensional pattern such as lines, or a two-dimensional pattern such as mesh of holes.

Figure 3D:
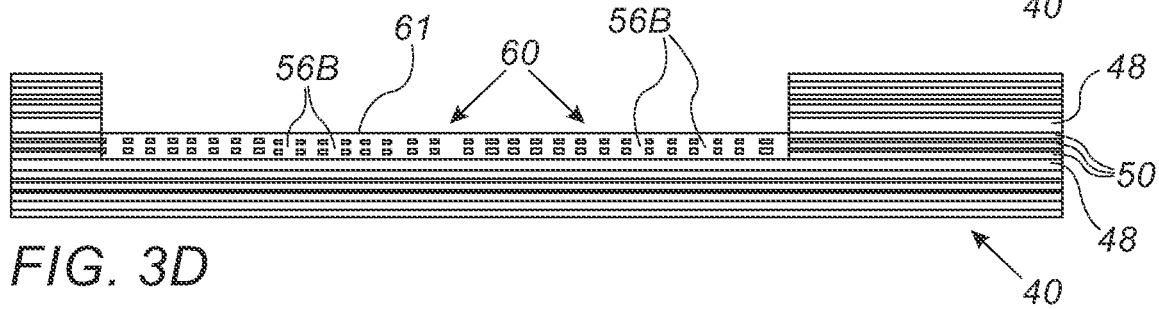

Finally, an overlayer of a thermally conductive material (e.g., copper) is disposed on the perforated recessed area, for example using metal plating. The result, seen in FIG. 3D, is heat conducting path 60 that comprises metal-filled holes 56B and external surface 61.

The schematic sectional views shown in FIGS. 3A-D are brought by way of example. The composition and layer arrangement of PCB 40 may be different than that shown and described. Many details of processing steps, as well as some processing steps as a whole, are omitted for clarity. For example, possible steps of lithography to form masks, and surface polishing a deposited heat conductive overlayer to finish external surface 61, are not shown.

Figure 4:
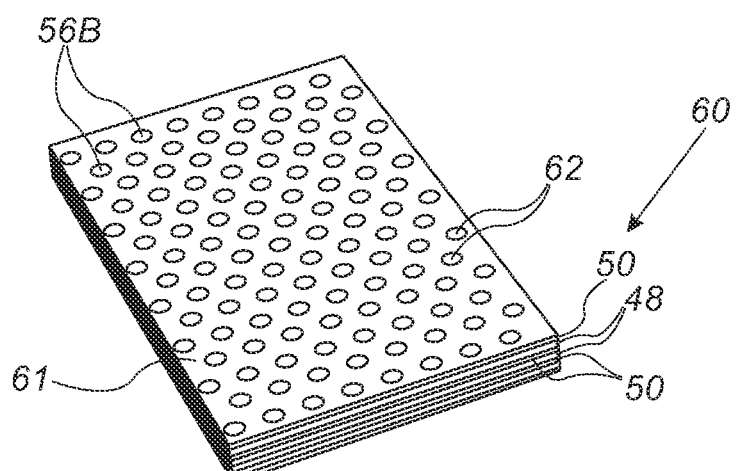
FIG. 4 is schematic pictorial isometric view of the lateral heat conducting path in the recessed area of the PCB of FIG. 1, in accordance with an embodiment of the present invention.

FIG. 4 is schematic, pictorial isometric view of the lateral heat conducting path in the recessed area of the PCB of FIG. 1, in accordance with an embodiment of the present invention. In the shown embodiments, filled voids 56B form a two-dimensional mesh of metal-filled circular holes 62. Filled holes 62 form thermal channels to heat conducting layers 50 and, as a whole, lateral heat conducting path 60 serves as a foundation for mounting (i.e., on external surface 61 of path 60) SiPh chip 22 and TEC 30.

The isometric view shown in FIG. 4 is brought by way of example. The geometry of voids 56 may differ and be any designed one-dimensional and/or two-dimensional pattern, as described above.

Compensation for Temperature-Induced Wavelength Variations, by Adaptive Control of TEC In some practical implementations, SiPh chip 22 of assembly 10 comprises one or more temperature-sensitive components. The temperature-sensitive components may comprise, for example, any of photonic devices 24A, 24B and 24C, or any other suitable component. In the present context, the term "temperature-sensitive component" means a component whose operating wavelength changes with temperature. For example, the operating wavelength of a micro-ring or an electro-absorption modulator will typically drift if the temperature increases or decreases. The level of temperature sensitivity depends on the component and its underlying principle of operation.

In some opto-electronic transceiver assemblies, for example, such temperature dependence should be accurately controlled so that the modulation characteristics are optimized, or such that the operating wavelength is constrained within a specific wavelength range. More generally, in some embodiments the wavelength behavior of the SiPh devices (possibly in combination with the wavelength behavior of other components such as the laser) is accurately controlled using an external control loop.

Figure 5:
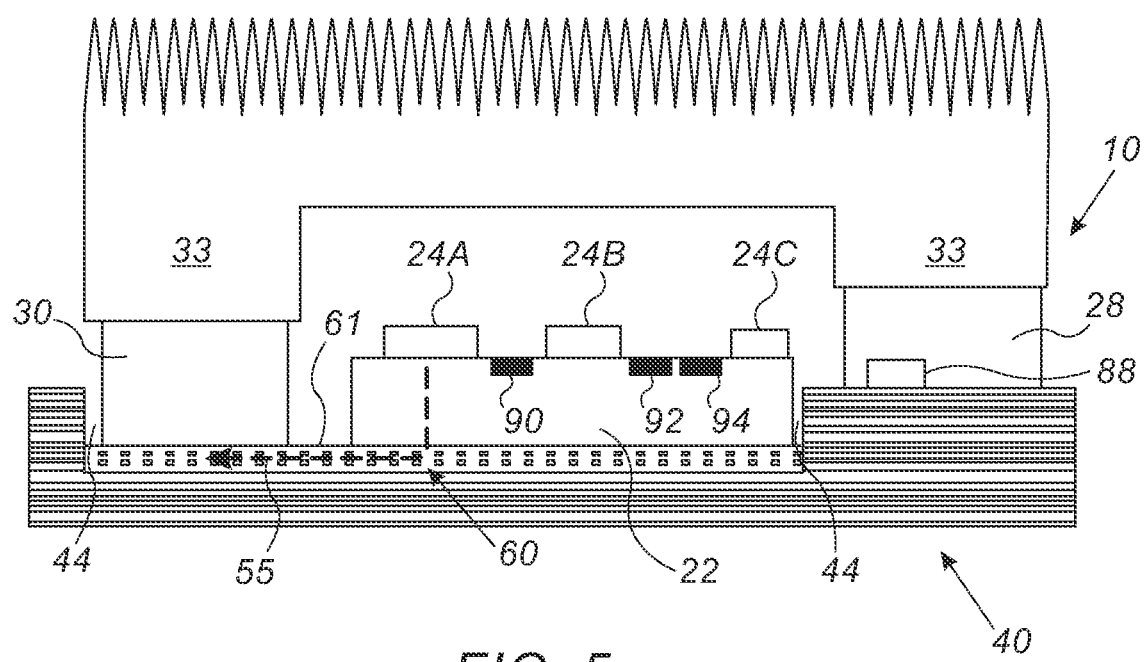
FIG. 5 is a side view of another semiconductor device assembly comprising a TEC and a SiPh chip, including additional components for controlling operating wavelengths of the SiPh chip by adaptive control of the TEC, in accordance with an alternative embodiment of the present invention.

FIG 5 is a side view of semiconductor device assembly 10, including additional components for controlling operating wavelengths of SiPh chip 22 by adaptively control of TEC 30, in accordance with another embodiment of the present invention.

Consider, for example, transceivers that are designed for communication over Data Center links. Typically, such transceivers are split into two major categories, referred to as Parallel Single-Mode (PSM) and Wavelength Division Multiplexing (WDM). In some embodiments, assembly 10 can be tailored to match the requirements of each transceiver category.

In a PSM system, for example, the wavelength pitch between the channels of the transceiver is not critical. Since each channel emits a respective optical signal into its own respective fiber channel, there is substantially no crosstalk. The operating wavelength range, however, is predefined so as to ensure interoperability between different vendors (e.g., according to MSAs or IEEE specifications), or to meet any other architecture specifications defined in proprietary systems. For example, an 800G Pluggable MSA compliant transmitter must operate between the wavelengths 1304.5 nm and 1317.5 nm. In this case, the heat dissipation solution in assembly should be able to compensate for any ambient temperature changes, ensuring that the above wavelength limit is respected.

In some embodiments, this sort of control is implemented using a temperature sensor 90 (such as a thermistor) that is attached to the surface of SiPh chip 22. In an embodiment, temperature readings from sensor 90 are sent to a control circuit 88 (e.g., a microcontroller, in the present example part of IC 28). Control circuit 90 controls TEC 30 as a function of the temperature readings, so as to tune the wavelengths of the optical components of chip 22. In some embodiments, control circuit 90 comprises a suitable Look-Up Table (LUT) for controlling the TEC as a function of the temperature reading of sensor 90.

The above-described control loop is useful for tuning the overall wavelength operating range of the optical components. However, in some use-cases (e.g., in some WDM systems such as LAN-WDM or DWDM), in addition to setting the overall operating wavelength range of the transceiver, it is necessary to accurately control the wavelength pitch between individual channels. For example, LAN-WDM channels must be separated by 4.5 nm, while the pitch of DWDM channels may be as dense as 100-200 GHz.

To meet this requirement, in some embodiments, transceiver assembly 10 features wavelength stabilization at the channel level, so as to control the wavelength of each channel individually. Such control could in principle be performed through pre-characterization and LUTs, using the control loop described above. Alternatively, a more accurate and reliable solution would be to implement an individual control loop per channel.

In some embodiments, chip 22 comprises one or more monitoring circuits 92 and one or more local temperature-control devices 94 (e.g., heaters). Each monitoring circuit 92 and its corresponding temperature-control device 94 are associated with the optical components of a respective channel (such the modulator, or the modulator and the laser of a channel). For a given channel, the respective monitoring circuit 92 typically measures the power level of the optical signal on sonic wavelength-sensitive element of the channel circuitry, so that the measured power level is maximal when the signal wavelength optimal. For a given channel, the respective monitoring circuit 92 reports the measurement result to control circuit 88. Control circuit 88 controls the respective temperature-control device 94 to set the temperature in the vicinity of the optical components of the channel in question. Circuit 92 and device 94 are typically duplicated per channel, or possibly per group of channels. In this manner, the wavelengths of individual channels can be adapted in a closed loop to compensate for temperature sensitivity of the optical components. The closed-loop feedback can be set using LUTs, or in any other suitable way.

In example embodiments, monitoring circuit 92 comprises a tap photodetector (e.g., a photodetector and a 99/1 splitter) that can monitor the power on the line, or a photodetector measuring the drop port in the case of a micro-ring modulator. Temperature-control device 94 may comprise, for example, a silicon photonics heater that can be implemented as part of the BELL stack (e.g., with metal), or the FEOL stack (e.g., with doped regions). Alternatively, any other suitable implementations can be used.

In some embodiments, in CWDM systems, the disclosed control scheme may be similar to that of LAN-WDM or DWDM, but possibly with much more relaxed operating wavelength limits. The 800G-FR4 specifications of the 800G Pluggable MSA, for example, allow for 13 nm wavelength drift per channel (similar to PSM) and specify a channel pitch of 20 nm.

Although the embodiments described herein mainly address thermal solution for circuitries transmitting and/or receiving optical, as well as electrical signals, at high rates for communication, such as in plug able transceiver modules, the methods and systems described herein can also be used in other applications, such as in mid-board optics modules, for example, along OED (consortium for on-board optics) guidelines for key critical component for co-packaging. The disclosed technique may thus be applied to a photonic transceiver module that instead of a pluggable, is hosted in a specialized assembly very close to a high power switching electronic chip.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed is the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A semiconductor device assembly, comprising:
a multi-layer printed circuit board (PCB) comprising a lateral heat conducting path formed in a recessed area of the PCB;
a thermoelectric cooler (TEC) and a chip disposed on the PCB, side-by-side to one another within the recessed area, such that entire bottom surfaces of both the chip and the TEC are mounted directly on the lateral heat conducting path, wherein the TEC is configured to evacuate heat from the chip via the lateral heat conducting path, and to dissipate the evacuated heat via a first end of a heat sink in thermal contact with the TEC; and
packaged integrated circuitry (IC) disposed on an un-recessed area of the PCB, wherein the packaged IC is configured to dissipate heat via a second end of the heat sink that is in thermal contact with the packaged IC.

2. The assembly according to claim 1, wherein the chip comprises a silicon photonics (SiPh) chip.

3. The assembly according to claim 1, wherein the lateral heat conducting path comprises heat conducting layers of the PCB, which are in thermal contact with an external surface of the heat conducting path via vertical heat conducting channels.

4. The assembly according to claim 3, wherein the vertical heat conducting channels of the PCB are filled with thermally conductive material.

5. The assembly according to claim 1, wherein the lateral heat conducting path is thermally isolated from the IC.

6. The assembly according to claim 1, wherein the heat sink is attached to a top side of the TEC and to a top side of the packaged IC, wherein the top sides of the TEC and the packaged IC are laterally separated by at least a lateral size of the chip.

7. The assembly according to claim 1, and comprising a control circuit configured to adaptively control the TEC based on an operating power of the chip.

8. The assembly according to claim 1, wherein the chip comprises one or more optical components, and comprising a control circuit configured to control one or more operating wavelengths of the one or more optical components by adaptively controlling the TEC.

9. The assembly according to claim 8, wherein the chip comprises a temperature sensor, and wherein the control circuit is configured to control the one or more operating wavelengths by obtaining a reading of the temperature sensor and controlling the TEC based on the reading.

10. The assembly according to claim 8, wherein, by controlling the TEC, the control circuit is configured to tune an operating wavelength range of the one or more optical components.

11. The assembly according to claim 8, wherein the chip comprises one or more temperature-control devices, and wherein the control circuit is configured to control the one or more operating wavelengths by controlling both the TEC and the one or more temperature-control devices.

12. The assembly according to claim 11, wherein the one or more temperature-control devices are configured to control one or more temperatures of one or more respective optical components associated with one or more respective communication channels, and wherein the control circuit is configured to individually tune the one or more operating wavelengths of the one or more respective communication channels by controlling the one or more respective temperature-control devices.

13. A manufacturing method, comprising:
forming in a recessed area of a multi-layer printed circuit board (PCB) a lateral heat conducting path;
disposing on the PCB a thermoelectric cooler (TEC) and a chip, side-by-side to one another within the recessed area, such that entire bottom surfaces of both the chip and the TEC are mounted directly on the lateral heat conducting path, wherein the TEC is configured to evacuate heat from the chip via the lateral heat conducting path, and to dissipate the evacuated heat via a first end of a heat sink in thermal contact with the TEC; and
disposing on an un-recessed area of the PCB packaged integrated circuitry (IC), wherein the packaged IC is configured to dissipate heat via a second end of the heat sink that is in thermal contact with the packaged IC.

14. The manufacturing method according to claim 13, wherein the chip comprises a silicon photonics (SiPh) chip.

15. The manufacturing method according to claim 13, wherein forming the lateral heat conducting path comprises forming thermal contact via vertical heat conducting channels between heat conducting layers of the PCB and an external surface of the heat conducting path.

16. The manufacturing method according to claim 10, and comprising filling the vertical heat conducting channels of the PCB with thermally conductive material.

17. The manufacturing method according to claim 13, wherein the lateral heat conducting path is thermally isolated from the IC.

18. The manufacturing method according to claim 13, wherein the heat sink is attached to a top side of the TEC and to a top side of the packaged IC, and wherein the top sides of the TEC and the packaged IC are laterally separated by at least a lateral size of the chip.

* * * * *